(12) United States Patent
Chang

(10) Patent No.: US 12,190,992 B2
(45) Date of Patent: Jan. 7, 2025

(54) COMMAND PROCESSING CIRCUIT AND DATA PROCESSING CIRCUIT

(71) Applicant: CHANGXIN MEMORY TECHNOLOGIES, INC., Hefei (CN)

(72) Inventor: Liping Chang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 236 days.

(21) Appl. No.: 18/150,803

(22) Filed: Jan. 6, 2023

(65) Prior Publication Data
US 2023/0368823 A1 Nov. 16, 2023

Related U.S. Application Data

(63) Continuation of application No. PCT/CN2022/101688, filed on Jun. 27, 2022.

(30) Foreign Application Priority Data

May 13, 2022 (CN) .......................... 202210521967.9

(51) Int. Cl.
*G11C 7/10* (2006.01)
*G11C 7/22* (2006.01)

(52) U.S. Cl.
CPC ............ *G11C 7/109* (2013.01); *G11C 7/1093* (2013.01); *G11C 7/222* (2013.01)

(58) Field of Classification Search
CPC ..................................................... G11C 7/109
USPC ......................................................... 327/107
See application file for complete search history.

(56) References Cited

U.S. PATENT DOCUMENTS

| 6,115,322 A * | 9/2000 | Kanda | .................. | G11C 7/1078 |
| | | | | 365/189.05 |
| 7,042,799 B2 * | 5/2006 | Cho | ..................... | G11C 7/1093 |
| | | | | 365/189.16 |

FOREIGN PATENT DOCUMENTS

| CN | 1820322 A | 8/2006 |
| CN | 101097777 A | 1/2008 |
| CN | 101188137 A | 5/2008 |
| CN | 102281051 A | 12/2011 |
| CN | 109584944 A | 4/2019 |
| CN | 111247586 A | 6/2020 |

* cited by examiner

*Primary Examiner* — Tomi Skibinski
(74) *Attorney, Agent, or Firm* — Kilpatrick Townsend & Stockton LLP

(57) ABSTRACT

Embodiments provide a command processing circuit and a data processing circuit, including a plurality of flip-flops. An output terminal of a former flip-flop is connected to an input terminal of a latter flip-flop. The flip-flop is configured to sample, according to switching of a data strobe signal, an internal write command inputted into the command processing circuit to obtain a sampling command, to sample data. An output terminal of a target flip-flop is connected to a target terminal of a first flip-flop, the target flip-flop is a flip-flop whose time of outputting an active level overlaps target time, where the target time is start time and/or end time of a pulse in the internal write command. The target flip-flop is configured to reset the internal write command in the first flip-flop by outputting the active level.

15 Claims, 4 Drawing Sheets

COMMAND PROCESSING CIRCUIT AND DATA PROCESSING CIRCUIT

CROSS-REFERENCE TO RELATED APPLICATION

This application is a continuation of PCT/CN2022/101688, filed on Jun. 27, 2022, which claims priority to Chinese Patent Application No. 202210521967.9 titled "COMMAND PROCESSING CIRCUIT AND DATA PROCESSING CIRCUIT" and filed to the State Intellectual Property Office on, May 13, 2022, the entire contents of which are incorporated herein by reference.

TECHNICAL FIELD

Embodiments of the present disclosure relate to the field of semiconductor technology, and more particularly, to a command processing circuit and a data processing circuit.

BACKGROUND

In the field of semiconductor technologies, a memory chip is configured to store data, and a process of writing data to the memory chip is implemented under the control of an internal write command IWR. A controller may first send the internal write command IWR to the memory chip, and send data DQ to be written and a corresponding data strobe signal DQS to the memory chip after a preset clock cycle, to instruct the memory chip to store the DQ according to the IWR and the DQS.

In the prior art, a process of storing the DQ according to the IWR and the DQS by the memory chip may include the following main steps. First, the memory chip inputs the IWR and the DQS into an IWR processing circuit. The IWR processing circuit includes a plurality of flip-flops arranged in sequence to sample the IWR according to switching of the DQS to obtain a sampling command. Next, the memory chip samples the DQ according to the sampling command to obtain data to be written, to write the data into the memory chip.

However, the above solution has the problem of lower data write accuracy.

SUMMARY

Embodiments of the present disclosure provide a command processing circuit and a data processing circuit to improve data write accuracy.

In one aspect, the embodiments of the present disclosure provide a command processing circuit, which includes a plurality of flip-flops arranged in sequence. An output terminal of a former one of the plurality of flip-flops is connected to an input terminal of a latter one of the plurality of flip-flops. The plurality of flip-flops are configured to sample, according to switching of a data strobe signal, an internal write command inputted into the command processing circuit to obtain a sampling command, where the sampling command is configured for sampling data.

In another aspect, the embodiments of the present disclosure provide a data processing circuit, which includes a data sampling circuit and the command processing circuit, where the data sampling circuit is configured to sample data according to a sampling command outputted by the command processing circuit.

DETAILED DESCRIPTION

Technical solutions in the embodiments of the present disclosure will be described clearly and completely below, in conjunction with the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

It should be explained that in the specification, the claims and the foregoing accompanying drawings of the present disclosure, a term such as "first" or "second" is intended to separate between similar objects but is not intended to describe a particular sequence or precedence order. It is to be understood that data used like this may be interchangeable where appropriate, such that the embodiments of the present disclosure described herein can be implemented in sequences excluding those illustrated or described herein.

Furthermore, terms such as "comprise", "have" or other variants thereof are intended to cover a non-exclusive "comprise", for example, processes, methods, systems, products or devices comprising a series of steps or units are not limited to these steps or units listed explicitly, but comprise other steps or units not listed explicitly, or other steps or units inherent to these processes, methods, systems, products or devices.

Based on analysis of a data write process of a memory chip, it is found that when preamble time between adjacent two internal write commands IWR is two clock cycles, and the data write accuracy of the memory chip is lower. A specification stipulates that when the preamble time is one clock cycle, a phase deviation between a clock signal CKT and a data strobe signal DQS is allowed to be within 0.27 clock cycle. When the above preamble time is two clock cycles, the phase deviation between the clock signal CKT and the data strobe signal DQS is allowed to be within a range of 0.5 clock cycle. Under these two different phase deviation requirements, pulse widths of the internal write command may be different. For example, when the phase deviation is allowed to be around 0.27 clock, the pulse width of the internal write command IWR may be 0.5 clock cycle. When the phase deviation is allowed to be within the range of 0.5 clock cycle, the pulse width of the internal write command IWR needs to be set to two clock cycles.

Figure 1:
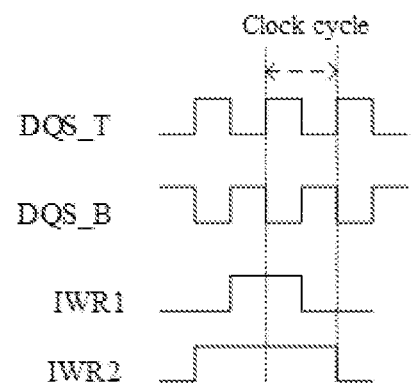
FIG. 1 is a schematic diagram showing a relationship between an internal write command IWR and a data strobe signal DQS according to an embodiment of the present disclosure.

However, as the pulse width of the above internal write command increases, one pulse width may correspond to two or more rising edges or two or more falling edges. FIG. 1 is a schematic diagram showing a relationship between an internal write command IWR and a data strobe signal DQS according to an embodiment of the present disclosure. Referring to FIG. 1, a pulse width of an internal write command IWR1 is one clock cycle, and a pulse width of an internal write command IWR2 is two clock cycles. A data strobe signal DQS_T samples an internal write command through a rising edge, and a data strobe signal DQS_B samples an internal write command through a falling edge.

As can be seen, for the internal write command IWR1 with the pulse width of one clock cycle, the rising edge of the data strobe signal DQS_T or the falling edge of the data strobe signal DQS_B corresponds to a center position of a pulse of IWR1, such that this pulse can be sampled. Because the width of IWR1 is one clock signal, one pulse of IWR1 corresponds to at most one rising edge of DQS_T and one falling edge of DQS_B. That is, a next rising edge of DQS_T and a next falling edge of DQS_B both appear after this pulse ends.

For the internal write command IWR2 with the pulse width of two clock cycles, the rising edge of the data strobe signal DQS_T or the falling edge of the data strobe signal DQS_B corresponds to a center position of a pulse of IWR2, such that this pulse is sampled. Because the width of IWR2 is two clock signals, an end position of the pulse of IWR2 corresponds to one rising edge of DQS_T and one falling edge of DQS_B.

For the above internal write command IWR2 with the pulse width of two clock cycles, when the internal write command IWR2 is sampled through the data strobe signal DQS to obtain a sampling command, variation of a rising edge of the internal write command IWR2 may likely occur, or variation of a rising edge of the data strobe signal DQS may likely occur, resulting in repeated sampling of the internal write command, which in turn leads to a data write error during sampling of data according to the sampling command.

Figure 2:
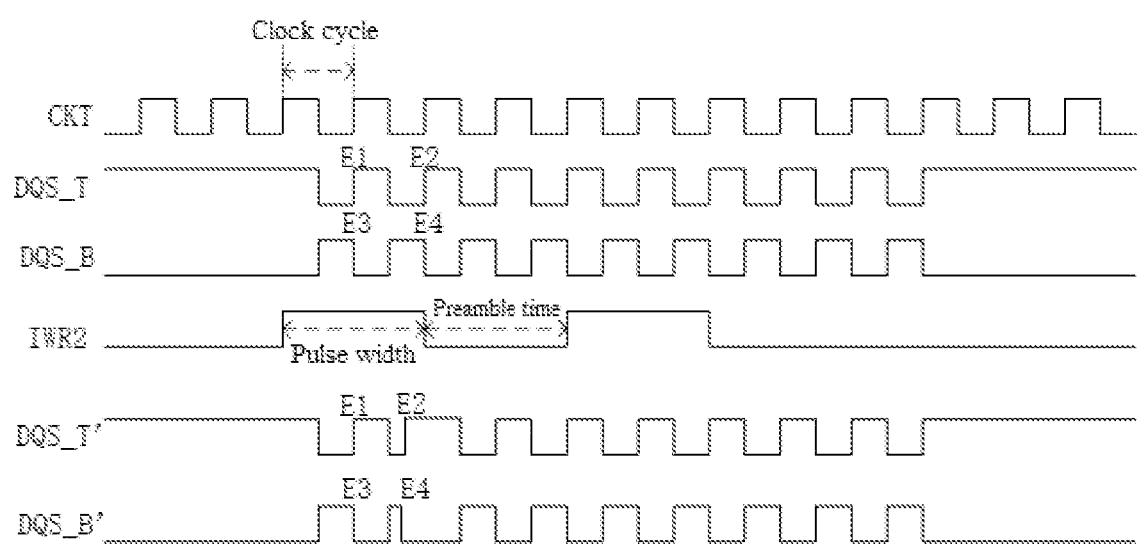
FIG. 2 is a schematic diagram showing a data write error scenario according to an embodiment of the present disclosure.

FIG. 2 is a schematic diagram showing a data write error scenario according to an embodiment of the present disclosure. Referring to FIG. 2, the pulse width of the internal write command IWR2 is two clock cycles of the clock signal CKT, and the preamble time between pulses of adjacent two internal write commands is also two clock cycles of the clock signal CKT. A data strobe signal DQS includes DQS_T and DQS_B, which have opposite phases. Both DQS_T and DQS_B may sample an internal write command but use different sampling timing. DQS_T may sample the internal write command IWR2 through a rising edge, and DQS_B may sample the internal write command IWR2 through a falling edge.

As can be seen from FIG. 2, a first rising edge E1 of DQS_T may sample a first pulse of the internal write command IWR2 to obtain a first internal write command. Similarly, a first falling edge E3 of DQS_B may sample the first pulse of the internal write command IWR2 to obtain the first internal write command.

However, during actual application, a falling edge or a rising edge of a pulse may change. For example, if a second rising edge E2 of DQS_T in FIG. 2 changes to E2 in DQS_T' in FIG. 2, two rising edges E1 and E2 in DQS_T' are both sampled to obtain the first pulse of the internal write command IWR2, which causes repeated sampling of the first internal write command.

Similarly, referring to FIG. 2, if a second falling edge E4 of DQS_B in FIG. 2 changes to E4 in DQS_B' in FIG. 2, two rising edges E3 and E4 of DQS_B' are both sampled to obtain the first pulse of the internal write command IWR2, which causes repeated sampling of the first internal write command.

As can be seen, for each pulse of the internal write command IWR2, an end position of the pulse may also change. For example, as shown in FIG. 2, the end position of the first pulse of the internal write command IWR2 may be delayed (an example of the delay is not given in FIG. 2). As a result, the first pulse of the internal write command IWR2 is repeatedly sampled by two rising edges of DQS_T or repeatedly sampled by two falling edges of DQS_B.

In addition, a start position of a pulse of the internal write command IWR2 may also be repeatedly sampled due to a variation of the rising edge of DQS_T, and/or a variation of the falling edge of DQS_T, and/or a variation of the falling edge of DQS_B.

It is to be noted that, during actual application, the above problem of repeated sampling may occur at the end position of each pulse of the internal write command IWR.

To solve the above problem, in the embodiments of the present disclosure, the start position and/or the end position of each pulse of an internal write command IWR2 may be reset to avoid repeated sampling caused by a variation. However, how to accurately ensure that the start position and/or the end position of the pulse of the internal write command IWR2 is reset is the key to solving the problem.

After analyzing an IWR2 processing circuit that samples the internal write command, the inventor finds that the circuit includes a plurality of flip-flops arranged in sequence. An input of a first flip-flop is the internal write command. Each flip-flop may use, according to switching of a data strobe signal DQS, an output of a previous flip-flop as an output of a current flip-flop.

Based on this finding, a target flip-flop may be selected, and the start position and/or the end position of the internal write command is reset through output of the target flip-flop. In some embodiments, the target flip-flop is a flip-flop whose time of outputting an active level overlaps target time. The target time is start time and/or end time of a pulse of the internal write command. The start time corresponds to the start position of the pulse of the internal write command IWR2, and the end time corresponds to the end position of the pulse of the internal write command IWR2. As can be seen, when the target flip-flop outputs the active level, the pulse of the internal write command IWR2 reaches the start position or the end position, such that the active level can accurately reset the start position or the end position. That is, the target flip-flop may accurately reset the start position and/or the end position of the pulse of the internal write command IWR2.

Technical solutions of the embodiments of the present disclosure and how to solve the above technical problems based on the technical solutions of the present disclosure are described in detail below with reference to some embodiments. The following embodiments may be combined with each other, and the same or similar concepts or processes may not be repeated in some embodiments. The embodiments of the present disclosure will be described below with reference to the accompanying drawings.

FIGS. 3 to 6 are schematic structural diagrams of a plurality of command processing circuits according to an embodiment of the present disclosure. Referring to FIGS. 3 to 6, the above command processing circuit 100 may include a plurality of flip-flops 101 arranged in sequence, where an output terminal of a former flip-flop 101 is connected to an input terminal of a latter flip-flop 101. The plurality of flip-flops 101 are configured to sample, according to switching of a data strobe signal, an internal write command inputted into the command processing circuit 100 to obtain a sampling command, where the sampling command is configured for sampling data. An output terminal of a target flip-flop in the plurality of flip-flops 101 is connected to a target terminal of a first flip-flop 101, and the target flip-flop is a flip-flop whose time of outputting an active level overlaps target time, where the target time is start time and/or end time of a pulse in the internal write command. The target flip-flop is configured to reset the internal write command in the first flip-flop by outputting the active level.

First, it is to be noted that although the embodiments of the present disclosure are intended to solve the above problem of repeated sampling of the internal write command with the pulse width of two clock cycles, and the first flip-flop is reset through the target flip-flop. However, because the target flip-flop in the embodiments of the present disclosure is a flip-flop whose time of outputting an active level overlaps the target time of the pulse and is reset through the active level, the embodiments of the present disclosure may also be applied to a processing process of the internal write command with the pulse width of one clock cycle, but is not limited to the internal write command with the pulse width of two clock cycles.

As can be seen, the above flip-flops are configured to buffer the internal write command, and each flip-flop may buffer the internal write command for one clock cycle. A commonly used flip-flop is a D flip-flop (DFF).

Figure 6:
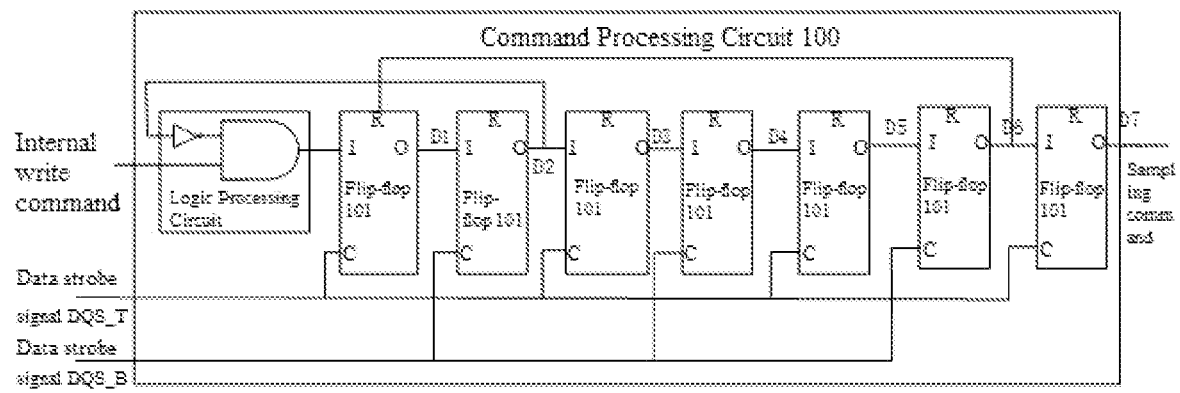

During actual application, number of the above flip-flops may be flexibly set. FIG. 6 is a schematic structural diagram of a command processing circuit comprising seven flip-flops according to an embodiment of the present disclosure. Referring to FIG. 6, input of the command processing circuit is used as input of the first flip-flop, and output of a last flip-flop, that is, output of the seventh flip-flop, is used as output of the command processing circuit, where the output is an obtained sampling command.

Each of the above flip-flops has a plurality of ports: an input terminal I, an output terminal O, a reset terminal R, and a clock terminal C.

The input terminal I is a port configured to input data. In the embodiments of the present disclosure, input data of the input terminal I of the first flip-flop is the internal write command. Input data of the input terminal I of a latter flip-flop is data outputted by the output terminal O of a former flip-flop.

The output terminal O is configured to output data. In the embodiments of the present disclosure, output data of the output terminal O of the last flip-flop is used as output data of the command processing circuit, and output data of the output terminal O of rest of the remaining flip-flops are inputted to an input terminal of a next flip-flop.

The reset terminal R is configured to reset data in the flip-flop when the active level is received, that is, set the data to an inactive level. When the active level is a high level, the inactive level is a low level. When the active level is the low level, the inactive level is the high level.

It is to be noted that the target terminal may be the input terminal I and/or the reset terminal R. When the target terminal is the reset terminal R, because the function of the reset terminal R is reset, referring to FIG. 4, the output terminal O of the target flip-flop is directly connected to the reset terminal R to implement reset. When the target terminal is the input terminal I, because the function of the input terminal I is input rather than reset, referring to FIG. 5, a logic processing circuit is required between the output terminal O and the input terminal I of the target flip-flop. The logic processing circuit is configured to perform logic processing on output data from the target flip-flop to implement reset.

As can be seen, the embodiments of the present disclosure can implement reset through the plurality of ports of the first flip-flop, such that when one port is abnormal, reset may be implemented through rest of the ports, which helps to improve reset success rate and improve the data write accuracy. In addition, reset of the start position and the end position of the internal write command may be simultaneously implemented through two ports, to avoid repeated sampling caused by a variation of the start position or a variation of the end position, thereby further improving the write accuracy.

Figure 3:
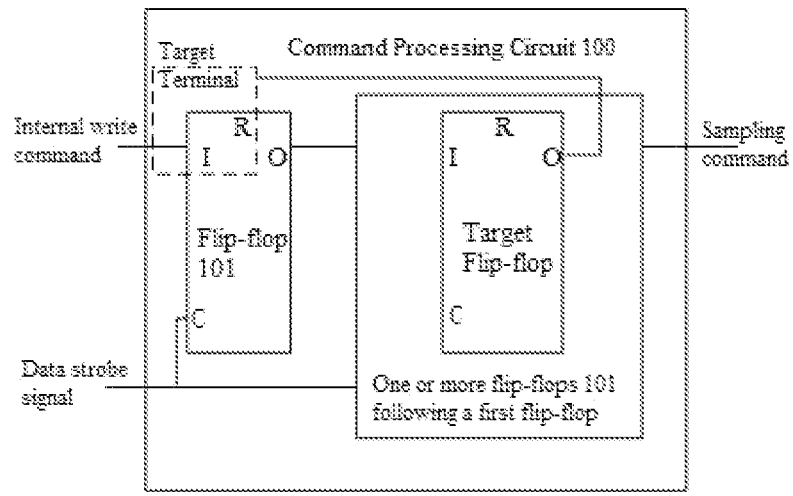
FIGS. 3 to 6 are schematic structural diagrams of four command processing circuits according to an embodiment of the present disclosure.
Figure 4:
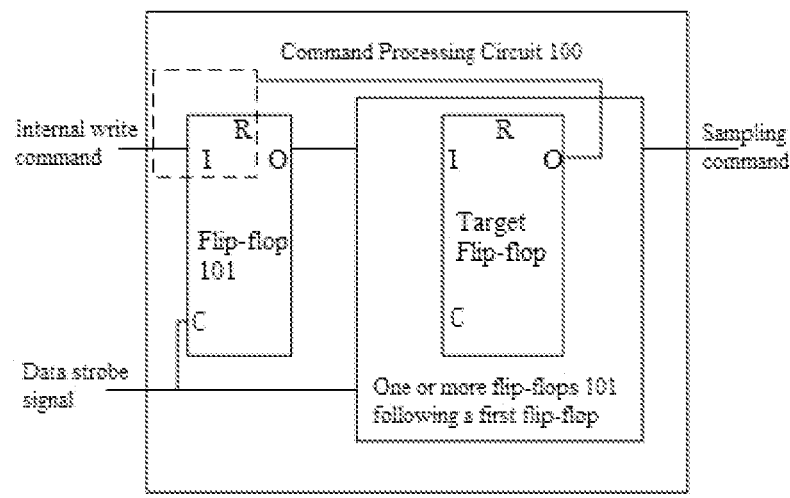
Figure 5:
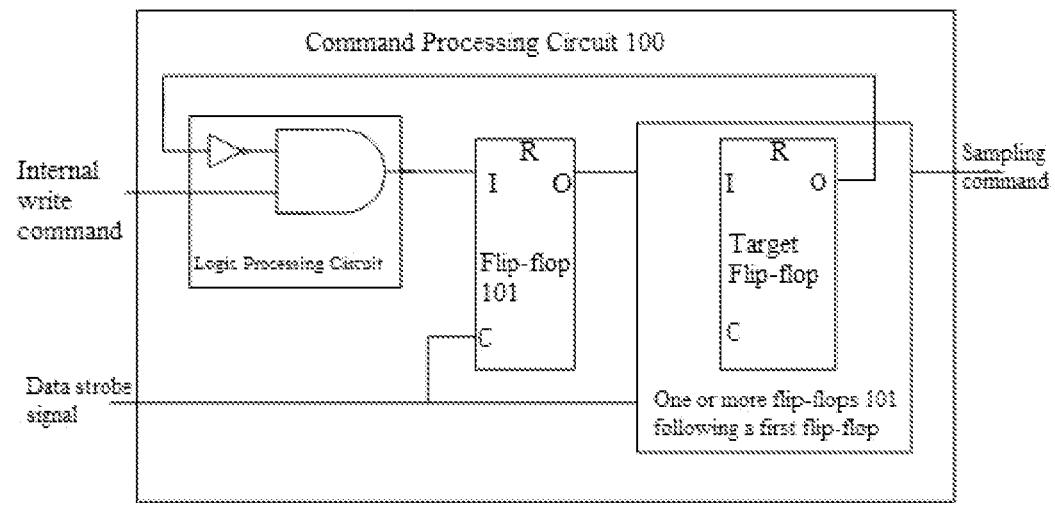

FIGS. 3 to 5 are schematic structural diagrams of another command processing circuit according to an embodiment of the present disclosure. Referring to FIG. 5, one input terminal of the above logic processing circuit is connected to the output terminal O of the target flip-flop, other input terminal of the logic processing circuit is configured to input the internal write command, and an output terminal of the logic processing circuit is connected to the input terminal I of the first flip-flop.

The logic processing circuit is configured to input reset data to the first flip-flop when the target flip-flop outputs the active level and the internal write command is the active level. It is to be understood that, because the target flip-flop is a flip-flop whose time of outputting an active level overlaps target time, and the target time is start time and/or end time of a pulse of the internal write command. When the target flip-flop outputs the active level, the internal write command corresponds to the end position or start position. In this case, when the internal write command is the active level, the active level of the internal write command may be reset to the inactive level, which also implements the reset of the start position and/or the end position of the internal write command.

As can be seen, in the embodiments of the present disclosure, reset may be directly implemented through the reset terminal, and reset can also be implemented by combining the input terminal and the logic processing circuit. That is, the reset is implemented through an auxiliary input terminal of the logic processing circuit, such that the input terminal also has the function of reset.

It is to be noted that when the internal write command is the active level, if the internal write command is directly inputted to the command processing circuit, the sampling command obtained by sampling is the active level. In this case, if there is a variation of the rising edge or falling edge, the active level may be repeatedly sampled. That is, the same pulse corresponding to the internal write command may correspond to two pulses in the sampling command obtained by sampling. Although the internal write command is the active level, a signal inputted to the command processing circuit in the above solution is the inactive level, such that even if there is a variation of the rising edge or a variation of the falling edge, the sampling command obtained by sampling is the inactive level. In this way, repeated sampling of the internal write command can be prevented.

In some embodiments, to enable the logic processing circuit to achieve the above objective, reset data are inputted to the first flip-flop when the target flip-flop outputs the active level and the internal write command is the active level. Referring to FIG. 5, the logic processing circuit may include an inverter and an AND gate. The output terminal O of the target flip-flop is connected to an input terminal of the inverter. An output terminal of the inverter is connected to one input terminal of the AND gate, and the other input terminal of the AND gate inputs the internal write command.

The above logic processing circuit shown in FIG. 5 may have several input-output relationships as follows.

In a first input-output relationship, the target flip-flop outputs a high level, and the internal write command is the high level. In this case, an output is a low level. When the above active level is the high level and the inactive level is the low level, this input-output relationship may implement the reset of the internal write command.

In a second input-output relationship, the target flip-flop outputs the high level, and the internal write command is the low level. In this case, the output is the low level. As can be seen, the level of the output is consistent with that of the internal write command. That is, the internal write command is not processed. In this case, the internal write command actually inputted to the first flip-flop is consistent with the original internal write command.

In a third input-output relationship, the target flip-flop outputs the low level, and the internal write command is the high level. In this case, the output is the high level. Similarly, as can be seen, the level of the output is consistent with that of the internal write command. That is, the internal write command is not processed. In this case, the internal write command actually inputted to the first flip-flop is consistent with the original internal write command.

In a fourth input-output relationship, the target flip-flop outputs the low level, and the internal write command is the low level. In this case, the output is the low level. When the above active level is the low level and the inactive level is the high level, this input-output relationship may implement the reset of the internal write command.

As can be seen, in the embodiments of the present disclosure, not only the reset of the high level as the active level may be implemented on the basis of the first input-output relationship, but also the reset of the low level as the active level may be implemented on the basis of the fourth input-output relationship. In addition, in the second and third input-output relationships, it may be ensured that the internal write command is not processed. Therefore, in the embodiments of the present disclosure, reset can be accurately implemented by means of the logic processing circuit comprising the inverter and the AND gate. Because the inverter and the AND gate are common logic gates, implementation costs are lower and application scenarios are wider.

There may be two target flip-flops. When there are two target flip-flops, an output terminal O of one of the target flip-flops is connected to a reset terminal R of the first flip-flop, and an output terminal O of the other one of the target flip-flops is connected to one input terminal of the logic processing circuit. In this scenario, the start position of the internal write command may be reset, the end position may be reset, and repeated sampling caused by variation of the start position and the end position is avoided.

Certainly, during actual application, one target flip-flop may be disposed. An output terminal of the target flip-flop is connected to the reset terminal of the first flip-flop or the logic processing circuit, such that only repeated sampling caused by a variation of the start position or the end position may be avoided. When the target flip-flop is a flip-flop whose time of outputting the active level overlaps end time of a pulse of the internal write command, the reset of the end position may be implemented regardless of whether the output terminal of the target flip-flop is connected to the reset terminal or is connected to the input terminal by the logic processing circuit.

When the target flip-flop is a flip-flop whose time of outputting the active level overlaps start time of the pulse of the internal write command, the reset of the start position may be implemented regardless of whether the output terminal of the target flip-flop is connected to the reset terminal or is connected to the input terminal by the logic processing circuit.

In some embodiments, the target flip-flop that satisfies that the time of outputting an active level overlaps a target time may include at least one of a second flip-flop and a sixth flip-flop. Through analysis, it is found that among the plurality of flip-flops arranged in sequence, the second flip-flop and the sixth flip-flop are target flip-flops that first appear and satisfy the following conditions: the time of outputting the active level overlaps the target time. Therefore, in the embodiments of the present disclosure, reset can be implemented through the second flip-flop and the sixth flip-flop. In this way, the reset can be implemented only by ensuring that the number of flip-flops is greater than or equal to six. Compared with a fact that the target flip-flop is a flip-flop following the sixth flip-flop, the number of the flip-flops may be minimized in the embodiments of the present disclosure, thereby reducing a circuit dimension.

FIG. 6 is a schematic structural diagram of another command processing circuit according to an embodiment of the present disclosure. Referring to FIG. 6, the command processing circuit includes seven flip-flops, where output of a seventh flip-flop is used as a sampling command. Referring to FIG. 6, an output terminal O of a second flip-flop is connected to an input terminal I of a first flip-flop. That is, the output terminal O of the second flip-flop is connected to the input terminal I of the first flip-flop by a logic processing circuit. An output terminal O of a sixth flip-flop is connected to a reset terminal R of the logic processing circuit. As can be seen from FIG. 6, a distance between the second flip-flop and the first flip-flop is smaller, and a distance between the sixth flip-flop and the first flip-flop is larger. In this case, considering that the distances affect the signal transmission speed and therefore the reset delay, an output of the second flip-flop may be connected to the input terminal of the first flip-flop by the logic processing circuit, and an output of the sixth flip-flop may be directly connected to a reset terminal of the first flip-flop, such that the processing of the logic processing circuit further increases the duration for the output of the second flip-flop to reach the input terminal of the first flip-flop, to make a reset duration of the second flip-flop as close as possible to a reset duration of the sixth flip-flop.

Certainly, in addition to the connection mode shown in FIG. 6, the output terminal O of the sixth flip-flop may be connected to the input terminal I of the first flip-flop. That is, the output terminal O of the sixth flip-flop is connected to the input terminal I of the first flip-flop by the logic processing circuit, and the output terminal O of the second flip-flop is connected to the reset terminal of the logic processing circuit.

In an example, an overlap duration between the time of outputting the active level by the target flip-flop and the target time is less than half of the pulse width. In this way, it can be ensured that an end position and/or a start position of an internal write command can be reset to avoid repeated sampling, and it can also be avoided that a middle position of the internal write command is reset due to an excessively large reset length and as a result a reset internal write command cannot be sampled. Reference is made below taking FIG. 7 as an example.

Figure 7:
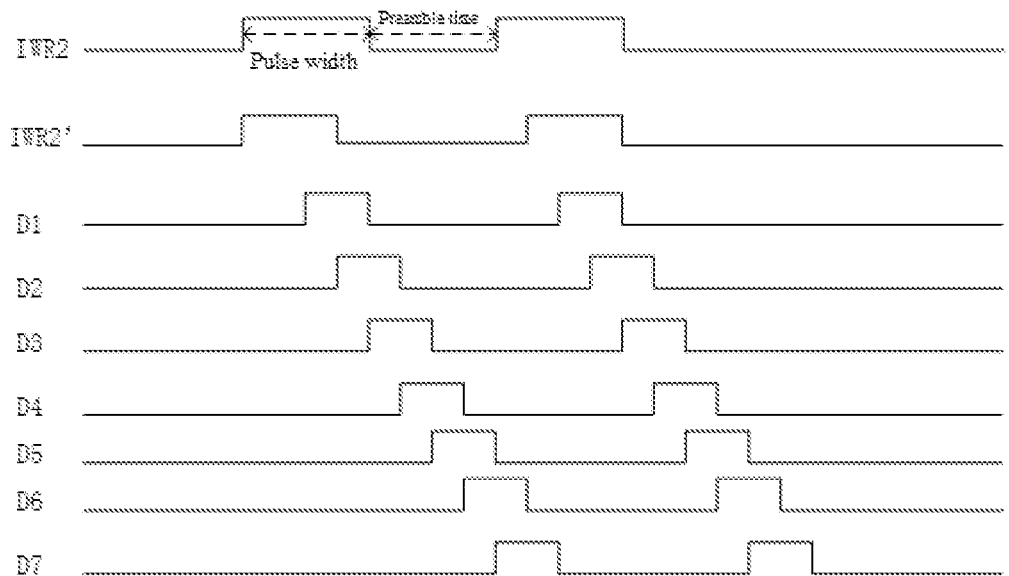
FIG. 7 is a timing diagram of writing data according to an embodiment of the present disclosure.

FIG. 7 is a timing diagram of writing data according to an embodiment of the present disclosure. Referring to FIGS. 7, D1 to D7 are respectively outputs of flip-flops arranged from left to right in FIG. 6. The following active level is the high level.

The high level in the output D1 of the first flip-flop in FIG. 7 overlaps the end position of the pulse of the internal write command IWR2 by one clock cycle in time, and the overlap is relatively large. If D1 is configured for reset, the end position of the reset internal write command is advanced by one clock cycle. As a result, a rising edge of a data strobe signal DQS_T or a falling edge of DQS_B corresponds to the end position of the reset internal write command, which causes failure of sampling of the reset internal write command.

A first high level in the output D2 of the second flip-flop in FIG. 7 overlaps the end position of a first pulse of the internal write command IWR2 by 0.5 clock cycle in time. If D2 is configured for reset, referring to FIG. 7, an end position of a first pulse of a reset internal write command IWR2' is advanced by 0.5 clock cycle. Therefore, in one aspect, the rising edge of the data strobe signal DQS_T or the falling edge of DQS_B corresponds to a high level position of the reset IWR2', which can ensure normal sampling of the pulse. In another aspect, because a next rising edge of the data strobe signal DQS_T or a next falling edge of DQS_B corresponds to a low level position of the reset IWR2', the pulse is not repeatedly sampled on the next rising edge of DQS_T or the next falling edge of DQS_B.

A first high level in the output D6 of the sixth flip-flop in FIG. 7 overlaps a start position of a second pulse of the internal write command IWR2 by 0.5 clock cycle in time. If D6 is configured for reset, referring to FIG. 7, a start position of a second pulse of a reset internal write command IWR2' is delayed by 0.5 clock cycle. Therefore, in one aspect, the rising edge of the data strobe signal DQS_T or the falling edge of DQS_B corresponds to the high level position of the reset IWR2', which can ensure normal sampling of the pulse. In another aspect, because a next rising edge of the data strobe signal DQS_T or a next falling edge of DQS_B corresponds to a low level position of the reset IWR2', the pulse is not repeatedly sampled on the next rising edge of DQS_T or the next falling edge of DQS_B.

A high level in the outputs D3 to D5 and D7 of the third flip-flop in FIG. 7 does not overlap a pulse of the internal write command IWR2 in time, such that reset of the internal write command IWR2 cannot be implemented by using the outputs.

It is to be understood that, in the embodiments of the present disclosure, the pulse width of the internal write command may be one or two clock cycles. Therefore, repeated sampling with a pulse width of two clock cycles can be avoided, and normal sampling with a pulse width of one clock cycle can be supported, thereby unifying processing circuits for the two pulse widths.

In an example, any adjacent two flip-flops use the data strobe signals opposite in phase. Referring to FIG. 6, there are seven flip-flops. A data strobe signal DQS_T is inputted at clock terminals C of the first, third, fifth, and seventh flip-flops, and a data strobe signal DQS_B is inputted at clock terminals C of the second, fourth, and sixth flip-flops. Because DQS_T and DQS_B are two signals opposite in phase, it is implemented that any adjacent two flip-flops use the data strobe signals opposite in phase.

In the embodiments of the present disclosure, speed of sampling the internal write commands by the plurality of flip-flops can be increased by means of the above two data strobe signals opposite in phase.

The embodiments of the present disclosure further provide a data processing circuit, including a data sampling circuit and the above command processing circuit. The data sampling circuit is configured to sample data according to a sampling command outputted by the command processing circuit. In this way, in the embodiments of the present disclosure, it can be ensured, by means of the command processing circuit, that a start position and/or an end position of a sampling command used in data sampling is reset, such that repeated sampling of the pulse of the same internal write command can be avoided. Furthermore, data sampling accuracy can be ensured during data sampling, and the data write accuracy can be improved.

Figure 8:
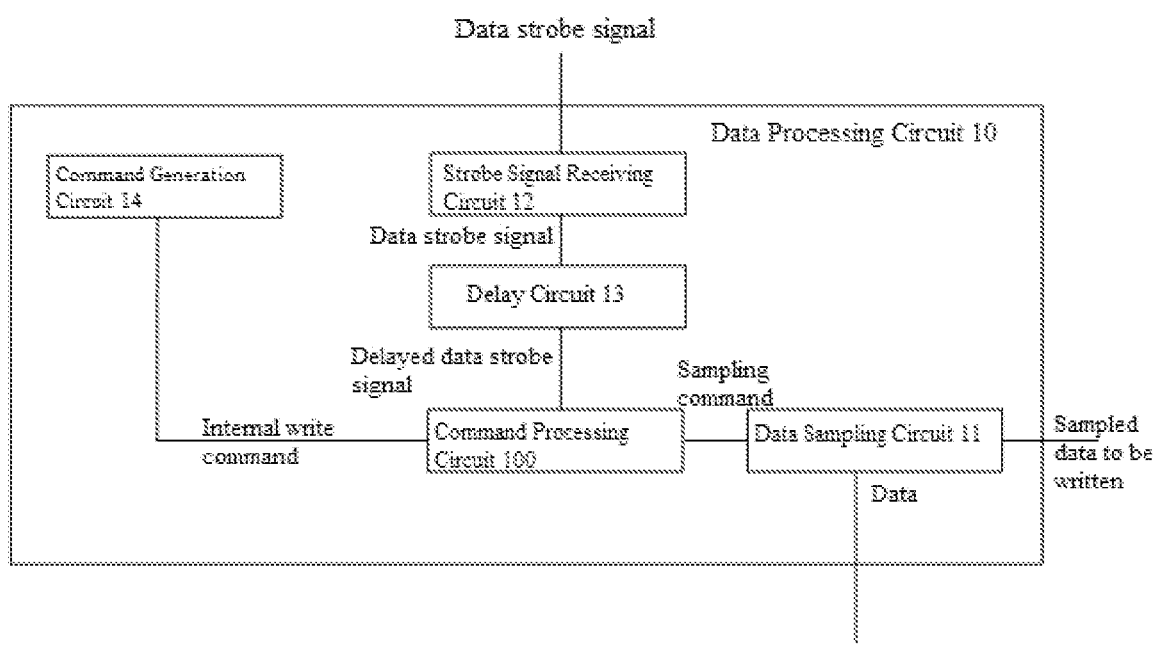
FIG. 8 is a schematic structural diagram of a data processing circuit according to an embodiment of the present disclosure.

FIG. 8 is a schematic structural diagram of a data processing circuit according to an embodiment of the present disclosure. Referring to FIG. 8, in addition to the command processing circuit 100 and the data sampling circuit 11, the data processing circuit 10 further includes a strobe signal receiving circuit 12. The strobe signal receiving circuit 12 is connected to the command processing circuit 100 via a delay circuit 13. The delay circuit 13 is configured to delay a data strobe signal received by the strobe signal receiving circuit 12 and send the delayed data strobe signal to the command processing circuit 100.

The function of the delay circuit is to delay the data strobe signal to ensure synchronization between the data strobe signal and an internal command signal, that is, to ensure that both the data strobe signal and the internal command signal can reach the command processing circuit simultaneously. In this way, it can be ensured that the data strobe signal samples the corresponding internal command signal, such that the write accuracy can be further improved.

In some embodiments, the delay circuit may perform delay by using a delay parameter. The delay parameter may be determined according to a difference between a transmission path of the data strobe signal and a transmission path of an internal write command. That is, the delay circuit is configured to compensate for a wiring difference between the data strobe signal and the internal write command. Generally, an initial transmission position of the data strobe signal and an initial transmission position of the internal write command are on two sides of the entire circuit, and the transmission path of the data strobe signal is shorter than that of the internal write command. The initial transmission position of the data strobe signal may be a position of the strobe signal receiving circuit 12 in FIG. 8, and the initial transmission position of the internal write command may be a position of a command generation circuit 14.

Certainly, in some special scenarios, if the transmission path of the data strobe signal is longer than that of the internal write command, the delay circuit may be disposed on the transmission path of the internal write command to delay the internal write command, such that the internal write command and the data strobe signal reach the command processing circuit simultaneously.

In some embodiments, referring to FIG. 8, the data processing circuit 10 may further include the command generation circuit 14 connected to the command processing circuit 100. The command generation circuit 14 is configured to generate an internal write command and send the internal write command to the command processing circuit 100. Various functions may be integrated in the data processing circuit in the embodiments of the present disclosure, to allow generation, command sampling and data sampling of the internal write command to be completed in one circuit, which is advantageous to improving integration level of the circuit. The command generation circuit herein may also be referred to as a TDQSS generation (TDQSS GEN, skew generation between the clock signal and DQS) circuit.

The command generation circuit herein may be externally connected to a command address line to generate the internal write command according to an electrical signal on the command address line. The command address line herein may include: a cloud service bus (CSB), an ACTB, a RASB, a CASB, and a WEB.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

For the convenience of explanation, the above description has been made in conjunction with some embodiments. However, the above exemplary discussion is not intended to be exhaustive or to limit the embodiments to the concrete forms disclosed above. Various modifications and variations can be obtained in light of the above teachings. The embodiments are selected and described to better explain the principles and the practical applications, and to enable those skilled in the art to better utilize the embodiments and with various modifications as are suited to the particular use contemplated.

What is claimed is:

1. A command processing circuit, comprising a plurality of flip-flops arranged in sequence, an output terminal of a former one of the plurality of flip-flops being connected to an input terminal of a latter one of the plurality of flip-flops, the plurality of flip-flops being configured to sample, according to switching of a data strobe signal, an internal write command inputted into the command processing circuit to obtain a sampling command, the sampling command being configured for sampling data;
wherein an output terminal of a target flip-flop in the plurality of flip-flops is connected to a target terminal of a first one of the plurality of flip-flops, the target flip-flop being a flip-flop whose time of outputting an active level overlaps target time, the target time being start time and/or end time of a pulse in the internal write command; and
wherein the target flip-flop is configured to reset the internal write command in the first flip-flop by outputting the active level.

2. The command processing circuit according to claim 1, wherein the target terminal comprises at least one of a reset terminal and an input terminal.

3. The command processing circuit according to claim 2, wherein when the target terminal comprises the input terminal, the command processing circuit further comprises a logic processing circuit;
wherein one input terminal of the logic processing circuit is connected to the output terminal of the target flip-flop, other input terminal of the logic processing circuit being configured to input the internal write command, and an output terminal of the logic processing circuit being connected to an input terminal of the first flip-flop; and wherein the logic processing circuit is configured to input reset data to the first flip-flop when the target flip-flop outputs the active level and the internal write command is the active level.

4. The command processing circuit according to claim 3, wherein the logic processing circuit comprises an inverter and an AND gate, the output terminal of the target flip-flop being connected to an input terminal of the inverter, an output terminal of the inverter being connected to one input terminal of the AND gate, and other input terminal of the AND gate being configured to input the internal write command.

5. The command processing circuit according to claim 3, wherein when number of the target flip-flops is two, an output terminal of one of the two target flip-flops is connected to the reset terminal of the first flip-flop, and an output terminal of the other one of the two target flip-flops is connected to one input terminal of the logic processing circuit.

6. The command processing circuit according to claim 3, wherein the target flip-flop comprises at least one of a second one of the plurality of flip-flops and a sixth one of the plurality of flip-flops.

7. The command processing circuit according to claim 6, wherein an output terminal of the second flip-flop is connected to the input terminal of the first flip-flop, and an output terminal of the sixth flip-flop is connected to one input terminal of the logic processing circuit.

8. The command processing circuit according to claim 1, wherein a pulse width of the internal write command is one or two clock cycles.

9. The command processing circuit according to claim 8, wherein an overlap duration between the time of outputting the active level by the target flip-flop and the target time is less than half of the pulse width.

10. The command processing circuit according to claim 1, wherein the active level is a high level.

11. The command processing circuit according to claim 1, wherein any adjacent two of the plurality of flip-flops use data strobe signals opposite in phase.

12. The command processing circuit according to claim 1, wherein number of the plurality of flip-flops is seven, output of a seventh one of the plurality of flip-flops being used as the sampling command.

13. A data processing circuit, comprising a data sampling circuit and the command processing circuit according to claim 1, the data sampling circuit being configured to sample data according to a sampling command outputted by the command processing circuit.

14. The data processing circuit according to claim 13, wherein the data processing circuit further comprises a strobe signal receiving circuit, the strobe signal receiving circuit being connected to the command processing circuit via a delay circuit, the delay circuit being configured to delay a data strobe signal received by the strobe signal receiving circuit and send the delayed data strobe signal to the command processing circuit.

15. The data processing circuit according to claim 14, wherein the data processing circuit further comprises a command generation circuit connected to the command processing circuit, the command generation circuit being configured to generate the internal write command and send the internal write command to the command processing circuit.

* * * * *